(12) United States Patent
Xu et al.

(10) Patent No.: US 12,170,305 B2
(45) Date of Patent: Dec. 17, 2024

(54) FLAT PANEL DETECTOR, DRIVING METHOD, DRIVING DEVICE AND FLAT PANEL DETECTION DEVICE

(71) Applicants: Beijing BOE Sensor Technology Co., Ltd., Beijing (CN); BOE Technology Group Co., Ltd., Beijing (CN)

(72) Inventors: Shuai Xu, Beijing (CN); Ye Zhang, Beijing (CN); Binbin Xu, Beijing (CN); Bin Zhao, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 208 days.

(21) Appl. No.: 17/477,325

(22) Filed: Sep. 16, 2021

(65) Prior Publication Data
US 2022/0223644 A1  Jul. 14, 2022

(30) Foreign Application Priority Data

Jan. 8, 2021 (CN) .......................... 202110023055.4

(51) Int. Cl.
*H01L 27/146* (2006.01)
*G01T 1/24* (2006.01)
*H04N 5/32* (2023.01)
*H04N 25/50* (2023.01)

(52) U.S. Cl.
CPC .......... *H01L 27/14659* (2013.01); *G01T 1/24* (2013.01); *H01L 27/14614* (2013.01); *H04N 5/32* (2013.01); *H04N 25/50* (2023.01)

(58) Field of Classification Search
CPC .......................... H01L 27/14614; H04N 25/50
See application file for complete search history.

(56) References Cited

U.S. PATENT DOCUMENTS

| | | | | |
|---|---|---|---|---|
| 5,917,199 A | * | 6/1999 | Byun | H01L 27/1214 257/E27.141 |
| 2003/0170937 A1 | * | 9/2003 | Eccleston | H10K 10/466 257/E21.291 |
| 2015/0071414 A1 | * | 3/2015 | Oda | A61B 6/54 378/207 |
| 2021/0202476 A1 | * | 7/2021 | Huang | H01L 21/823814 |

* cited by examiner

*Primary Examiner* — David P Porta
*Assistant Examiner* — Shun Lee
(74) *Attorney, Agent, or Firm* — IPro, PLLC

(57) ABSTRACT

The present disclosure discloses a flat panel detector, a driving method, a driving device and a flat panel detection device. The flat panel detector includes: a base substrate, and a plurality of detection units located on the base substrate; each of the detection units includes a photodiode and a detection transistor; the flat panel detector further includes: a compensation semiconductor material layer including a plurality of compensation structures mutually spaced; each detection transistor is correspondingly provided with a compensation structure, and the compensation structure is located between a gate and a gate insulating layer of the corresponding detection transistor.

14 Claims, 9 Drawing Sheets

FLAT PANEL DETECTOR, DRIVING METHOD, DRIVING DEVICE AND FLAT PANEL DETECTION DEVICE

CROSS-REFERENCE TO RELATED APPLICATIONS

The present disclosure claims priority to Chinese Patent Application No. 202110023055.4, filed with the China National Intellectual Property Administration on Jan. 8, 2021, the content of which is hereby incorporated by reference in its entirety.

FIELD

The present disclosure relates to the technical field of display, and particularly to a flat panel detector, a driving method, a driving device and a flat panel detection device.

BACKGROUND

The X-ray photography detects the intensity of X-rays penetrating through objects for imaging based on the characteristics of short wavelength and easy penetration of X-rays, and the feature that different tissues have different X-ray absorptions. A flat panel detector (FPD), as a core member of an X-ray imaging system, is responsible for converting the X-rays into an electrical signal for recording and imaging, and an image can be displayed through a display at the right time or stored to be read subsequently. Generally, the FPD includes a scintillator, an image sensor, a control module, a signal processing module and a communication module. The scintillator absorbs the X-rays and converts the X-rays into visible light; the image sensor is composed of a pixel array formed by a photodiode and a thin film transistor (TFT) switch, and converts the visible light generated by the scintillator into the electrical signal under driving of a control circuit; and the signal processing module amplifies the electrical signal and converts the electrical signal into a digital signal through an analog-digital converter, and imaging is realized after compensation processing.

SUMMARY

Embodiments of the present disclosure provide a flat panel detector, a driving method, a driving device and a flat panel detection device so as to improve imaging uniformity.

An embodiment of the present disclosure provides a flat panel detector, including: a base substrate, and a plurality of detection units located on the base substrate; each of the detection units includes a photodiode and a detection transistor; the flat panel detector further includes: a compensation semiconductor material layer; the compensation semiconductor material layer includes a plurality of compensation structures mutually spaced; each detection transistor is correspondingly provided with a compensation structure, and the compensation structure is located between a gate and a gate insulating layer of the corresponding detection transistor.

An embodiment of the present disclosure provides a driving method of a flat panel detector, including: an imaging detection stage, where the imaging detection stage includes: N continuous row collection stages, and N is a total number of rows of the detection units in the flat panel detector; in an $n^{th}$ row collection stage, controlling a detection transistor in each of the detection units to be cut off, and obtaining an imaging noise voltage corresponding to a photodiode in each of the detection units in an $n^{th}$ row, where $1 \leq n \leq N$ and n is an integer; controlling the detection transistor in each of the detection units in the $n^{th}$ row to be turned on, and obtaining an imaging detection voltage corresponding to the photodiode in each of the detection units in the $n^{th}$ row; and determining an imaging effective voltage corresponding to each photodiode in the $n^{th}$ row according to the imaging noise voltage and the imaging detection voltage corresponding to each photodiode in the $n^{th}$ row.

An embodiment of the present disclosure provides a driving device of a flat panel detector, including: a driving circuit, where the driving circuit is configured to execute the driving method mentioned above.

An embodiment of the present disclosure provides a flat panel detection device, including the flat panel detector mentioned above and/or the driving device of the flat panel detector mentioned above.

DETAILED DESCRIPTION

Figure 1:
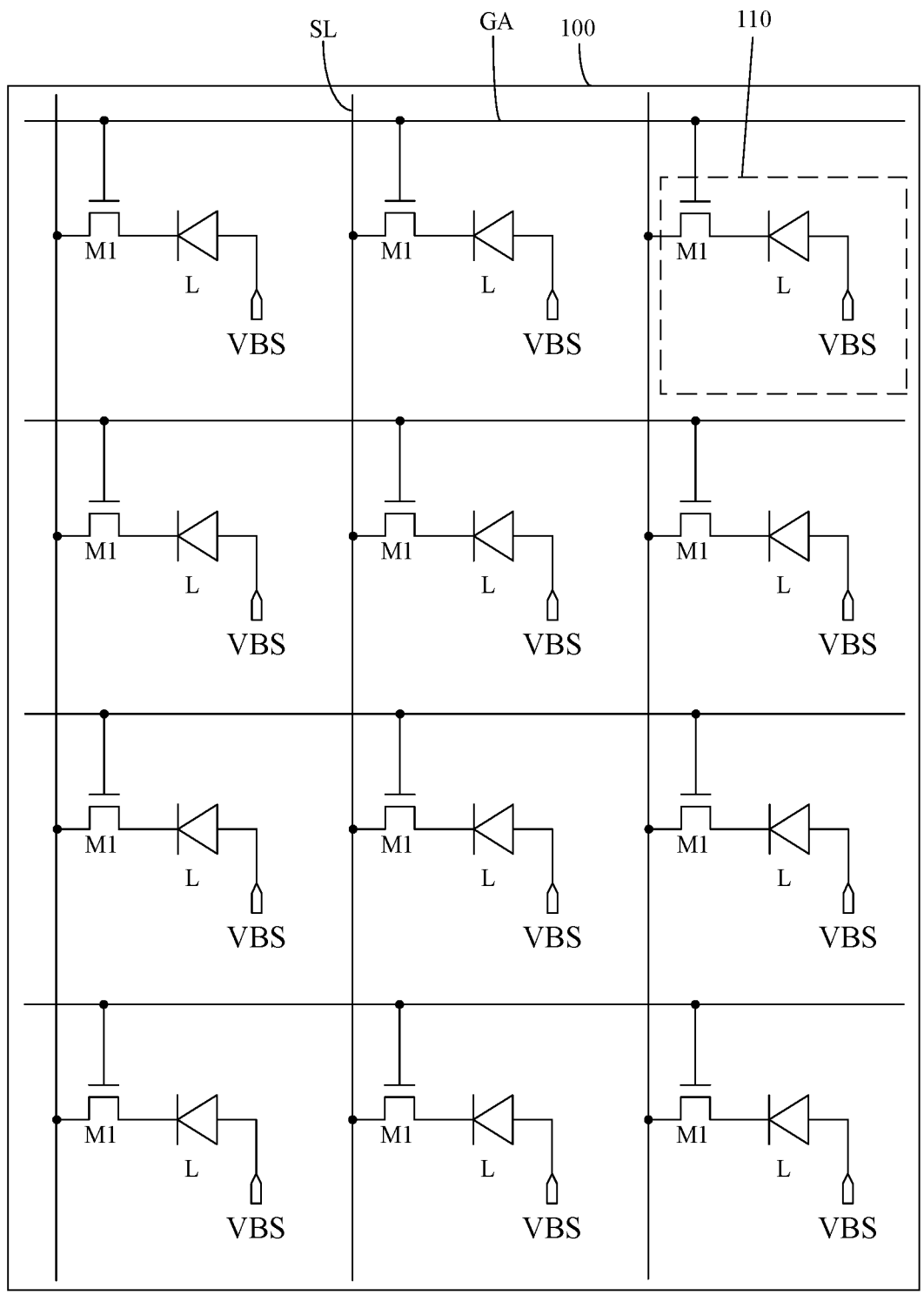
FIG. 1 is a schematic structural diagram of a flat panel detector in an embodiment of the present disclosure.

In order to make objectives, technical solutions and advantages of embodiments of the present disclosure clearer, the technical solutions of embodiments of the present disclosure will be clearly and fully described in combination with the accompanying drawings of embodiments of the present disclosure. Apparently, the described embodiments are only some, but not all of embodiments of the present disclosure. Embodiments and features in embodiments of the present disclosure can be mutually combined under the condition of no conflict. Based on the described embodiments of the present disclosure, all other embodiments obtained by those ordinarily skilled in the art without creative work belong to the protection scope of the present disclosure.

Unless otherwise defined, technical or scientific terms used herein should be understood commonly by those ordinarily skilled in the art of the present disclosure. "First", "second" and other similar words used herein do not denote any sequence, quantity or significance, but are only used for distinguishing different components. "Include", "contain" and other similar words mean that components or items preceding the word cover components or items and their equivalents listed after the word without excluding other components or items. "Connection", "joint" and other similar words may include electrical connection, direct or indirect, instead of being limited to physical or mechanical connection.

It should to be noted that sizes and shapes of all figures in the drawings do not reflect a true scale and are only intended to illustrate contents of the present disclosure. Same or similar reference numbers denote same or similar components or components with same or similar function all the time.

An embodiment of the present disclosure provides a flat panel detector, as shown in FIG. 1, including: a base substrate 100, and a plurality of detection units 110, a plurality of scanning lines GA and a plurality of detection lines SL located on the base substrate 100. Regions where the detection units 110 are located may be defined by the plurality of scanning lines GA and the plurality of detection lines SL. In some embodiments, the plurality of detection units 110 is distributed on the base substrate 100 in an array mode. In this way, the detection units 110 may be arranged periodically in a row direction and a column direction. In addition, these scanning lines GA may extend in the row direction and be arranged in the column direction. These data lines may extend in the column direction and be arranged in the row direction. One row of the detection units 110 corresponds to one scanning line GA, and one column of the detection units 110 corresponds to one detection line SL.

In some embodiments, as shown in FIG. 1, each of the detection units 110 may include a photodiode L and a detection transistor M1. A Gate M1-G of the detection transistor M1 is electrically connected with the corresponding scanning line GA, a second electrode of the detection transistor M1 is electrically connected with a negative electrode of the corresponding photodiode L, and a first electrode of the detection transistor M1 is electrically connected with the corresponding detection line SL.

Furthermore, the flat panel detector may further include a bias voltage signal line BL. A positive electrode of the photodiode L is electrically connected with the bias voltage signal line BL. In this way, a bias voltage may be inputted into the photodiode L through the bias voltage signal line BL, when the photodiode L receives a photo signal, an electrical signal may be generated under the action of a photoelectric conversion and may be transmitted to the detection transistor M1, thereby being transmitted to the detection line SL through the detection transistor M1 when the detection transistor M1 is turned on. In some embodiments, the detection transistor M1 may be, for example, a PIN-type photodiode L.

Figure 2:
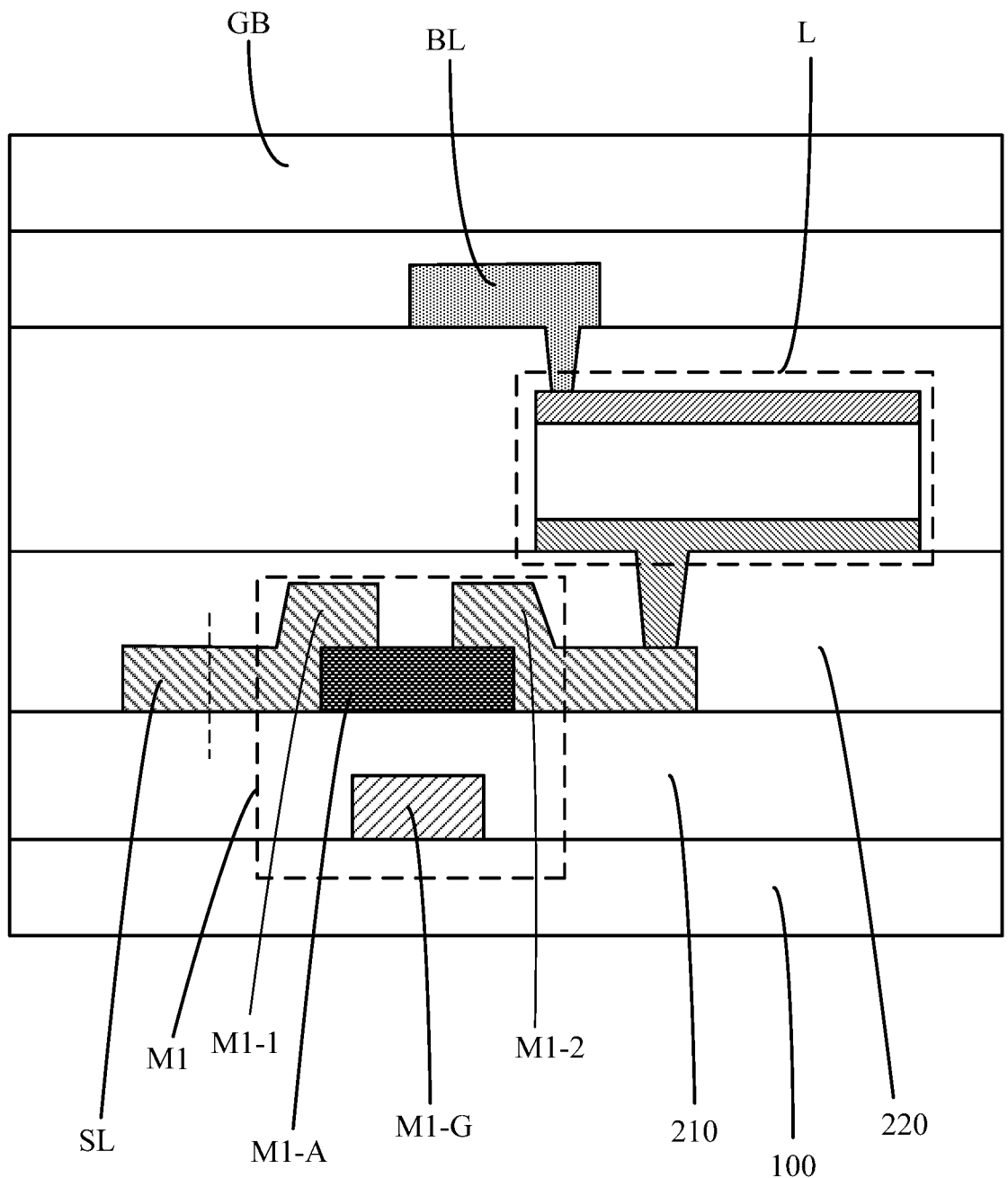
FIG. 2 is a schematic structural sectional view of some partial structures of the flat panel detector in an embodiment of the present disclosure.

In some embodiments, as shown in FIG. 2, the detection transistor M1 may include the gate M1-G located on the base substrate 100, a gate insulating layer 210 located on a side of the gate M1-G facing away from the base substrate 100, an active layer M1-A located on a side of the gate insulating layer 210 facing away from the base substrate 100, and a source-drain layer located on a side of the active layer M1-A facing away from the base substrate 100. The source-drain layer includes the second electrode M1-2 and the first electrode M1-1 of the detection transistor M1.

In some embodiments, as shown in FIG. 2, the photodiode L may include the negative electrode, a photoelectric conversion layer and the positive electrode stacked on the base substrate 100. For example, the photoelectric conversion layer may be patterned, so that one independent photoelectric conversion layer may be arranged in one detection unit 110. In addition, the negative electrode is also patterned, so that one independent negative electrode may be arranged in one detection unit 110. The positive electrode may cover the base substrate 100 in a whole layer.

In some embodiments, as shown in FIG. 2, a planarization layer 220 is arranged between a layer where the detection transistor M1 is located and a layer where the photodiode L is located. In some embodiments, the layer where the photodiode L is located is on a side of the planarization layer 220 facing away from the base substrate 100. In addition, the second electrode of the detection transistor M1 is electrically connected with the negative electrode of the photodiode L through a via hole penetrating through the planarization layer 220.

In some embodiments, in an embodiment of the present disclosure, as shown in FIG. 2, the flat panel detector further includes: a photoelectric insulating layer located on a side of the photodiode L facing away from the base substrate 100, the bias voltage signal line BL located on a side of the photoelectric insulating layer facing away from the base substrate 100, a bonding layer located on a side of the bias voltage signal line BL facing away from the base substrate 100, and a protective cover plate GB located on a side of the bonding layer facing away from the base substrate 100.

During imaging detection, firstly, the detection transistor M1 in each of the detection units 110 is generally controlled to be cut off, and an imaging noise voltage $V_{cds1}$ corresponding to the photodiode L in each of the detection units 110 is obtained; then the detection transistor M1 in each of the detection units 110 is controlled to be turned on row by row, and an imaging detection voltage $V_{cds2}$ corresponding to the photodiode L in each of the detection units 110 is obtained; and then for each photodiode L, the imaging noise voltage $V_{cds1}$ corresponding to the photodiode L is subtracted by the imaging detection voltage $V_{cds2}$ corresponding to the photodiode L, namely, $V_{cds2}-V_{cds1}$, so that a detection image is formed through a voltage obtained by $V_{cds2}-V_{cds1}$.

However, as a coupling capacitance $C_{gs}$ exists between the gate M1-G and the first electrode M1-1 of the detection transistor M1, and a coupling capacitance $C_{gd}$ exists between the gate M1-G and the second electrode M1-2 of the detection transistor M1, a coupling capacitance when the detection transistor M1 is turned on differs from a coupling capacitance when the detection transistors M1 is cut off. In some embodiments, when the detection transistor M1 is turned on, the coupling capacitance between the gate M1-G and the first electrode M1-1 of the detection transistor M1 is $C_{gs-on}$, and the coupling capacitance between the gate M1-G and the second electrode M1-2 of the detection transistor M1 is $C_{gd-on}$.

Figure 3:
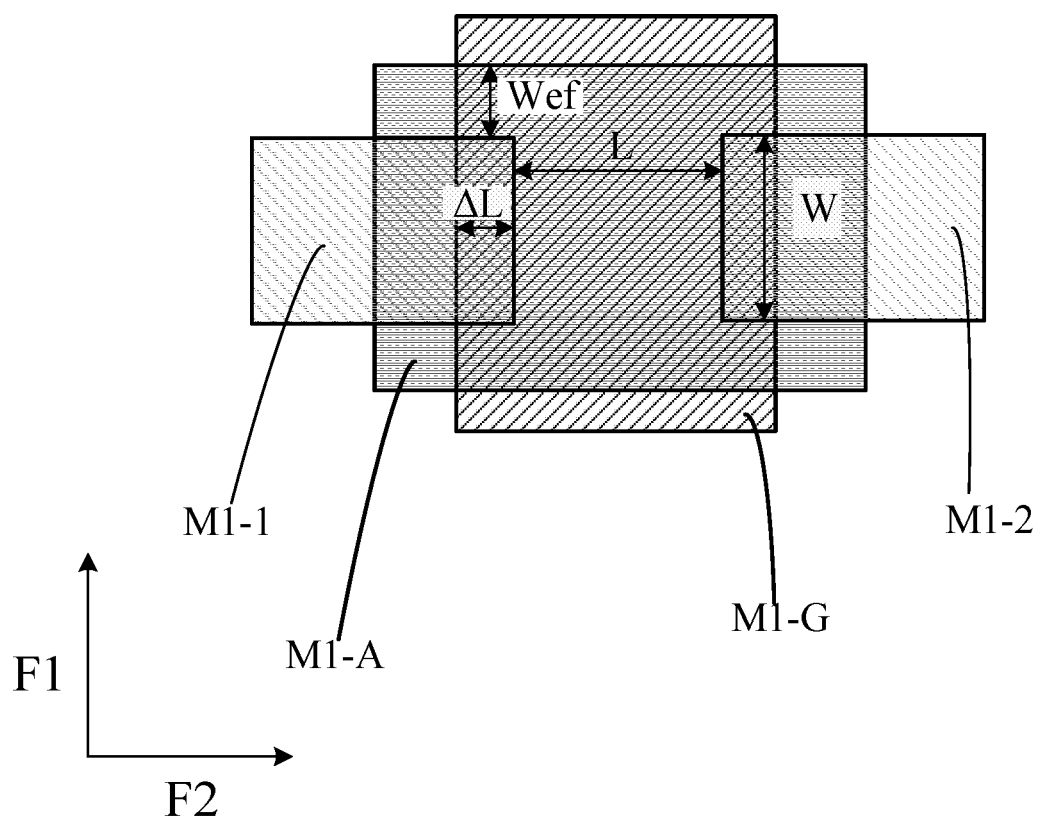
FIG. 3 is a schematic structural diagram of a detection transistor in an embodiment of the present disclosure.

In addition, as shown in FIG. 3, $$C_{gs-on} = C_{gd-on} = \varepsilon_0\varepsilon_r\frac{\left(\Delta L + \frac{L}{2}\right)*(W + 2Wef)}{t_{ox}}.$$

When the detection transistor M1 is cut off, the coupling capacitance between the gate M1-G and the first electrode M1-1 of the detection transistor M1 is $C_{gs-off}$, and the coupling capacitance between the gate M1-G and the second electrode M1-2 of the detection transistor M1 is $C_{gd-off}$.

In addition, $$C_{gs-off} = C_{gd-off} = \varepsilon_0 \varepsilon_r \frac{\Delta L * W}{t_{ox} + t_{si}}.$$

Here, $\varepsilon_0$ represents a dielectric constant in vacuum, $\varepsilon_r$ represents a relative dielectric constant, L represents a distance between an orthographic projection of the first electrode M1-1 of the detection transistor M1 on the base substrate 100 and an orthographic projection of the second electrode M1-2 of the detection transistor M1 on the base substrate 100 in an F2 direction, W represents a width of an orthographic projection of the first electrode M1-1 (or the second electrode M1-2) of the detection transistor M1 overlapping with the gate M1-G of the detection transistor M1 on the base substrate 100 in an F1 direction, Wef represents a width between the orthographic projection of the first electrode M1-1 (or the second electrode M1-2) of the detection transistor M1 on the base substrate 100 and an orthographic projection of the active layer M1-A on the base substrate 100 in the F1 direction, $\Delta L$ represents a width between the orthographic projection of the first electrode M1-1 (or the second electrode M1-2) of the detection transistor M1 overlapping with the gate M1-G on the base substrate 100 and the orthographic projection of the gate M1-G on the base substrate 100 in the F2 direction, $t_{ox}$ represents a thickness of an insulating layer between the gate M1-G and the active layer M1-A of the detection transistor M1 in an overlapping region, and $t_{si}$ represents a thickness of the active layer M1-A of the detection transistor M1. It should be noted that the widths W of the orthographic projections of the first electrode M1-1 and the second electrode M1-2 of the detection transistor M1 overlapping with the gate M1-G on the base substrate 100 in the F1 direction are equal. The widths $\Delta L$ between the orthographic projections of the first electrode M1-1 and the second electrode M1-2 of the detection transistor M1 overlapping with the gate M1-G on the base substrate 100 and the orthographic projection of the gate M1-G on the base substrate 100 in the F2 direction are equal. The widths Wef between the orthographic projections of the first electrode M1-1 and the second electrode M1-2 of the detection transistor M1 on the base substrate 100 and the orthographic projection of the active layer M1-A on the base substrate 100 in the F1 direction are equal.

It can be seen from the above formula that $C_{gs-on}$ and $C_{gd-on}$ are obviously larger than $C_{gs-off}$ and $C_{gd-off}$. In addition, $V_{cds2}=V_{cds1}+VL+\Delta V_o-\Delta V_o'$. VL represents a voltage after photoelectric conversion of light emitted into the photodiode L. $\Delta V_o$ represents a variation quantity of an increasing of $V_{cds2}$ from conducting to cut-off of the detection transistor M1, and $\Delta V_o'$ represents a variation quantity of a decreasing of $V_{cds2}$ from cut-off to conducting of the detection transistor M1. In addition, $$\Delta V_o = \frac{C_{gd-off}}{C_F} * \Delta V_g, \text{ and}$$

$$\Delta V_o' = \frac{C_{gd-on} + C_{gs-on}}{C_F} * \Delta V_g \cdot C_F$$

represents a sum of a capacitance of the detection transistor M1 and a capacitance of the photodiode L, and $\Delta V_g$ represents a difference value between a voltage on the gate M1-G when the detection transistor M1 is cut off and a voltage on the gate M1-G when the detection transistor M1 is turned on. It should be noted that the capacitance of the detection transistor M1 may be, for example, the coupling capacitance in the detection transistor M1. The capacitance of the photodiode L may be, for example, a capacitance formed by the positive electrode and the negative electrode of the photodiode L. As the capacitance of the detection transistor M1 is smaller than that of the photodiode L, during actual application, $C_F$ may be regarded as the capacitance of the photodiode L.

Then, $V_{cds2}-V_{cds1}=VL+\Delta V_o-\Delta V_o'$. Thus, $V_{cds2}-V_{cds1}$ includes a voltage $\Delta V_o-\Delta V_o'$ caused by the coupling capacitance besides the voltage VL for forming the detection image. Therefore, $V_{cds2}-V_{cds1}$ may be an effective voltage of the photodiode L after the photoelectric conversion by eliminating the influence of the coupling capacitance, thereby improving the uniformity of the formed detection image.

Figure 4:
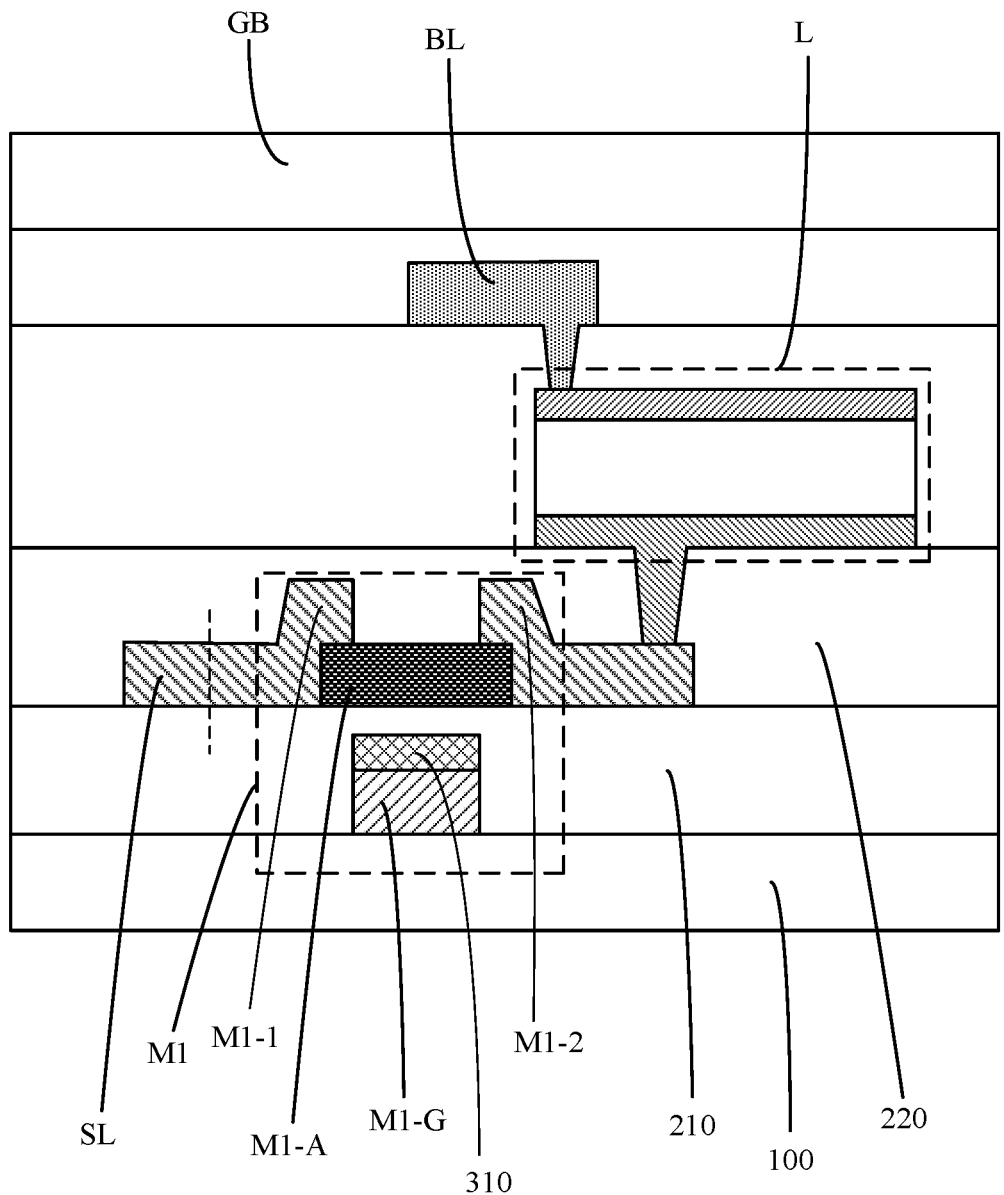
FIG. 4 is a schematic structural sectional view of some other partial structures of the flat panel detector in an embodiment of the present disclosure.

In view of this, the flat panel detector provided by an embodiment of the present disclosure, as shown in FIG. 4, may further include: a compensation semiconductor material layer located between the gate M1-G and the gate insulating layer 210 of the detection transistor M1. In some embodiments, the compensation semiconductor material layer may include a plurality of compensation structures 310 mutually spaced. Each detection transistor M1 is correspondingly provided with a compensation structure, and the compensation structure is located between the gate M1-G and the gate insulating layer 210 of the corresponding detection transistor M1. By arranging the compensation structure 310 of a semiconductor material, a Schottky contact may be formed between the compensation structure 310 and the gate M1-G of the detection transistor M1, so that a Schottky diode is formed. In this way, the unfavorable influence of the coupling capacitance $C_{gs}$ and the coupling capacitance $C_{gd}$ to the imaging detection voltage can be reduced, thus, the uniformity of the imaging detection voltage is improved, and the gray scale uniformity of the formed detection image is improved.

In some embodiments, as shown in FIG. 4, an orthographic projection of the compensation structure 310 on the base substrate 100 at least covers an orthographic projection of a surface of a side of the gate M1-G of the corresponding detection transistor M1 facing the active layer M1-A on the base substrate 100. In some embodiments, the orthographic projection of the compensation structure 310 on the base substrate 100 may overlap with the orthographic projection of the surface of the side of the gate M1-G of the corresponding detection transistor M1 facing the active layer M1-A on the base substrate 100. Alternatively, a gap may exist between the orthographic projection of the compensation structure 310 on the base substrate 100 and the orthographic projection of the surface of the side of the gate M1-G of the corresponding detection transistor M1 facing the active layer M1-A on the base substrate 100, so that the compensation structure 310 surround the gate M1-G.

In some embodiments, a material of the gate M1-G may include metal, for example, Al, Mo, Cu or the like. In some embodiments, as shown in FIG. 4, the gate M1-G may be of a single-layer structure, for example, the gate M1-G is formed by only Al or Mo.

Figure 5:
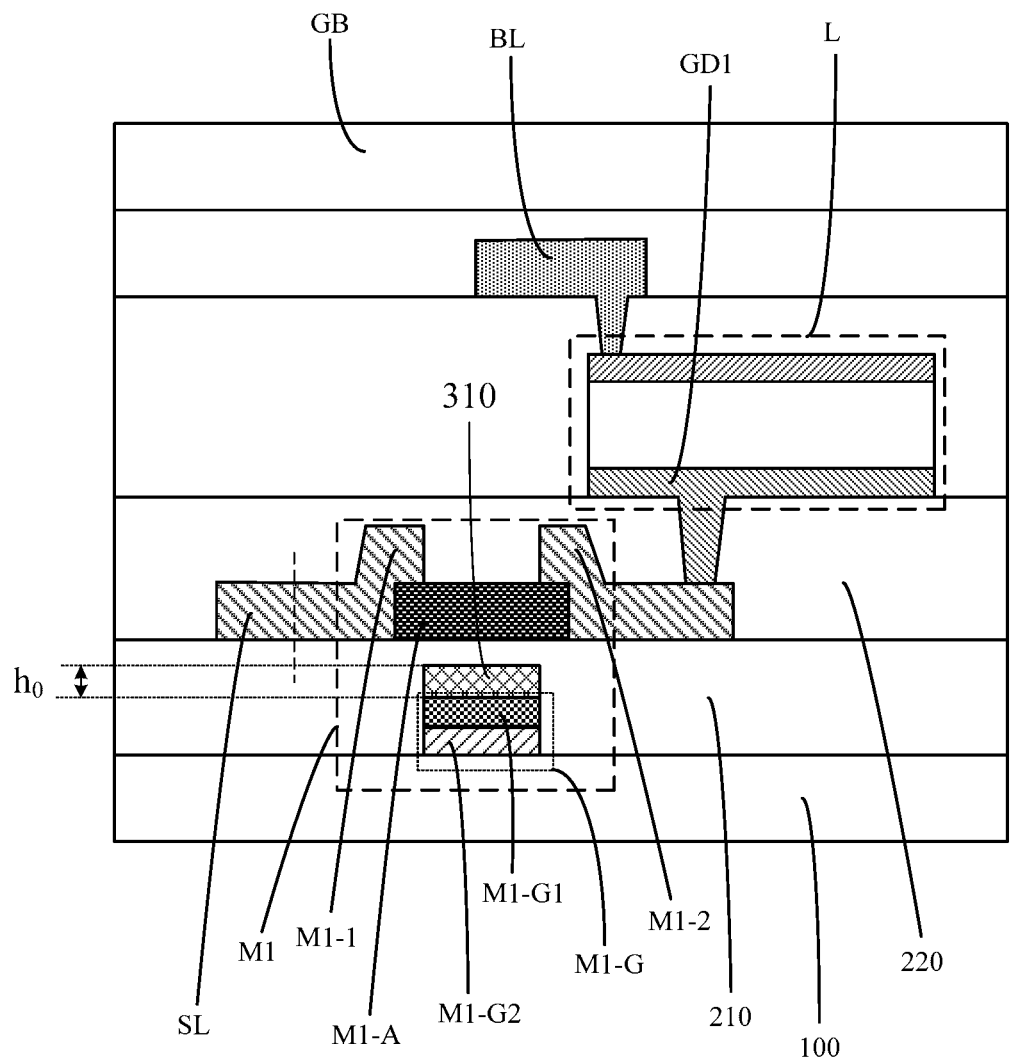
FIG. 5 is a schematic structural sectional view of yet some other partial structures of the flat panel detector in an embodiment of the present disclosure.

Alternatively, in some embodiments, the gates M1-G may be of a laminated structure. As shown in FIG. 5, the gate M1-G includes a plurality of gate M1-G film layers. Materials of the different gate M1-G film layers may be different. For example, the gate M1-G includes two gate M1-G film layers, the material of the gate M1-G film layer in direct contact with the compensation structure 310 may be Mo, and the material of the gate M1-G film layer away from the compensation structure 310 may be Al. Alternatively, the materials of some gate M1-G film layers are different, and the materials of some other gate M1-G film layers are the same, which is not limited herein.

In some embodiments, a material of the compensation semiconductor material layer may include: a doped P-type semiconductor material. For example, the material of the compensation semiconductor material layer may include: an ion-doped P-type a-si.

In some embodiments, in order to make a good Schottky contact between the compensation structure 310 and the gate M1-G, a work function of the compensation semiconductor material layer may be larger than a work function of the gate M1-G. Further, the work function of the compensation semiconductor material layer is larger than a work function of a gate M1-G film layer of the gate M1-G closest to the compensation semiconductor material layer. For example, when the material of the compensation semiconductor material layer includes the ion-doped P-type a-si and the material of the gate M1-G film layer in direct contact with the compensation structure 310 may be Mo, a work function of the Mo may be smaller than a work function of the doped P-type a-si. In actual application, the work function of the Mo is about in a range of 4.2 eV to 4.4 eV, and the work function of the P-type a-si is increased with increase of a doping concentration. When the doping concentration reaches $10^{14}$ cm$^{-3}$, the work function of the P-type a-si may reach 4.87 eV, and thus by using the doping concentration of the P-type a-si larger than a critical value (for example, $10^{14}$ cm$^{-3}$), the good Schottky contact may be formed between the gate M1-G and the compensation structure 310. Certainly, in actual application, the doping concentration may be designed and determined according to demands of the actual application and will not be limited herein.

Because of $V_{cds2}-V_{cds1}=VL+\Delta V_o-\Delta V_o'$, in order to eliminate the influence of the coupling capacitance, $\Delta V_o-\Delta V_o'=0$ is allowed, namely, $$\frac{C_{gd-off}}{C_F}*\Delta V_g = \frac{C_{gd-on}+C_{gs-on}}{C_F}*\Delta V_g \cdot C_{gd-off} = 2C_{gd-on}$$

is required. In some embodiments, a thickness $h_o$ of the compensation structure 310 may meet the following formula:

$$h_0 = \frac{(2\Delta L+L)*(W+2Wef)*(t_{ox}+t_{si})}{\Delta L+W} - t_{ox}.$$

In this way, $C_{gd-off}=2C_{gd-on}$, so that the influence of the coupling capacitance can be eliminated, and the gray scale uniformity of the detection image is improved.

Figure 6:
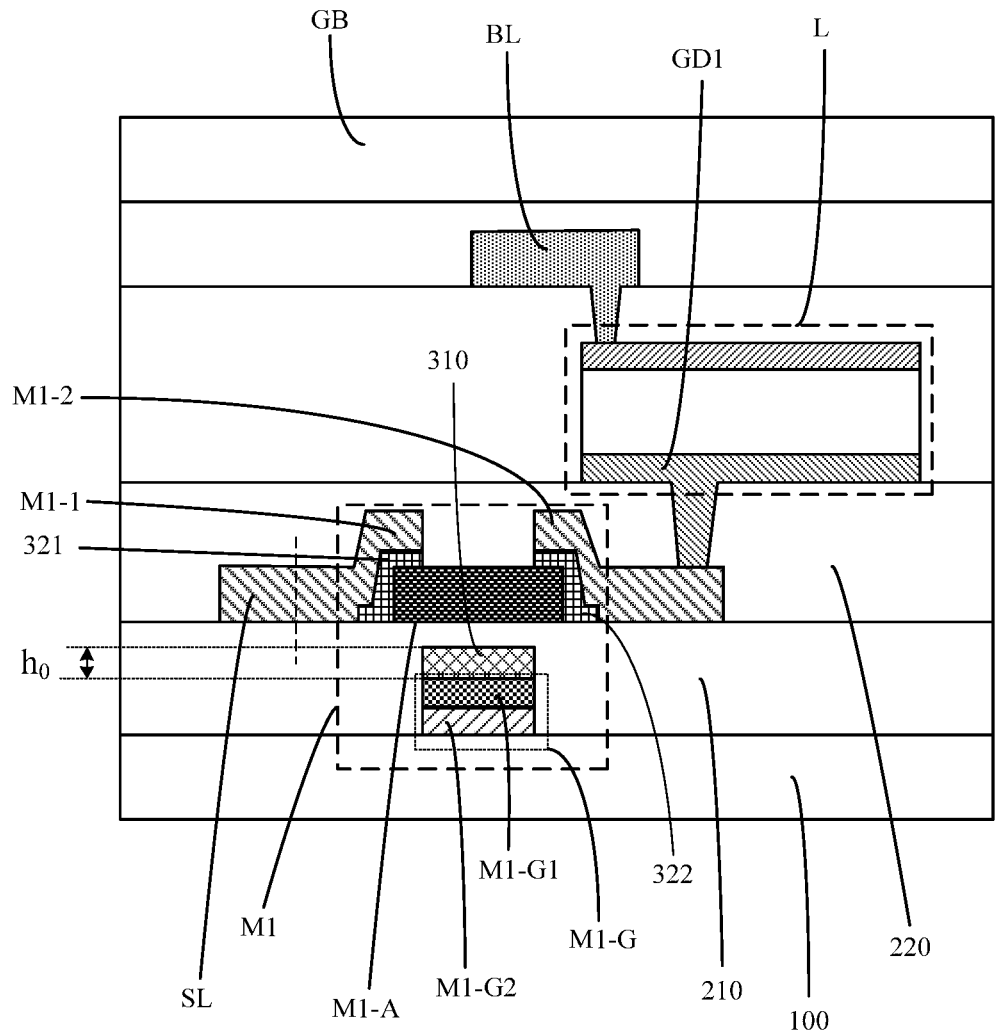
FIG. 6 is a schematic structural sectional view of yet some other partial structures of the flat panel detector in an embodiment of the present disclosure.

In order to improve features of the detection transistor M1, in some embodiments, as shown in FIG. 6, the flat panel detector may further include: a contact semiconductor material layer located between the active layer M1-A and the source-drain layer. In some embodiments, the contact semiconductor material layer may include a plurality of first contact structures 321 and a plurality of second contact structures 322 arranged in a spaced mode, the first electrode of the detection transistor M1 is correspondingly provided with one of the first contact structures 321, and the second electrode of the detection transistor M1 is correspondingly provided with one of the second contact structures 322, the orthographic projection of the first electrode of the detection transistor M1 on the base substrate 100 covers an orthographic projection of the corresponding first contact structure 321 on the base substrate 100, and the first electrode of the detection transistor M1 is in contact with the active layer M1-A through the corresponding first contact structure 321. The orthographic projection of the second electrode of the detection transistor M1 on the base substrate 100 covers an orthographic projection of the corresponding second contact structure 322 on the base substrate 100, and the second electrode of the detection transistor M1 is in contact with the active layer M1-A through the corresponding second contact structure 322.

In some embodiments, a material of the contact semiconductor material layer may include an N-type semiconductor material layer. For example, the material of the contact semiconductor material layer may be N-type a-Si.

An embodiment of the present disclosure further provides a driving method of a flat panel detector, including: an imaging detection stage. In some embodiments, the driving method may work on the basis of the flat panel detector of the above structure.

In some embodiments, the imaging detection stage may include: N continuous row collection stages, where N is a total number of rows of detection units in the flat panel detector. Namely, one row of detection units corresponds to one of the row collection stages. For example, an $n^{th}$ row of detection units may correspond to an $n^{th}$ row collection stage, where $1 \leq n \leq N$ and n is an integer.

Figure 7:
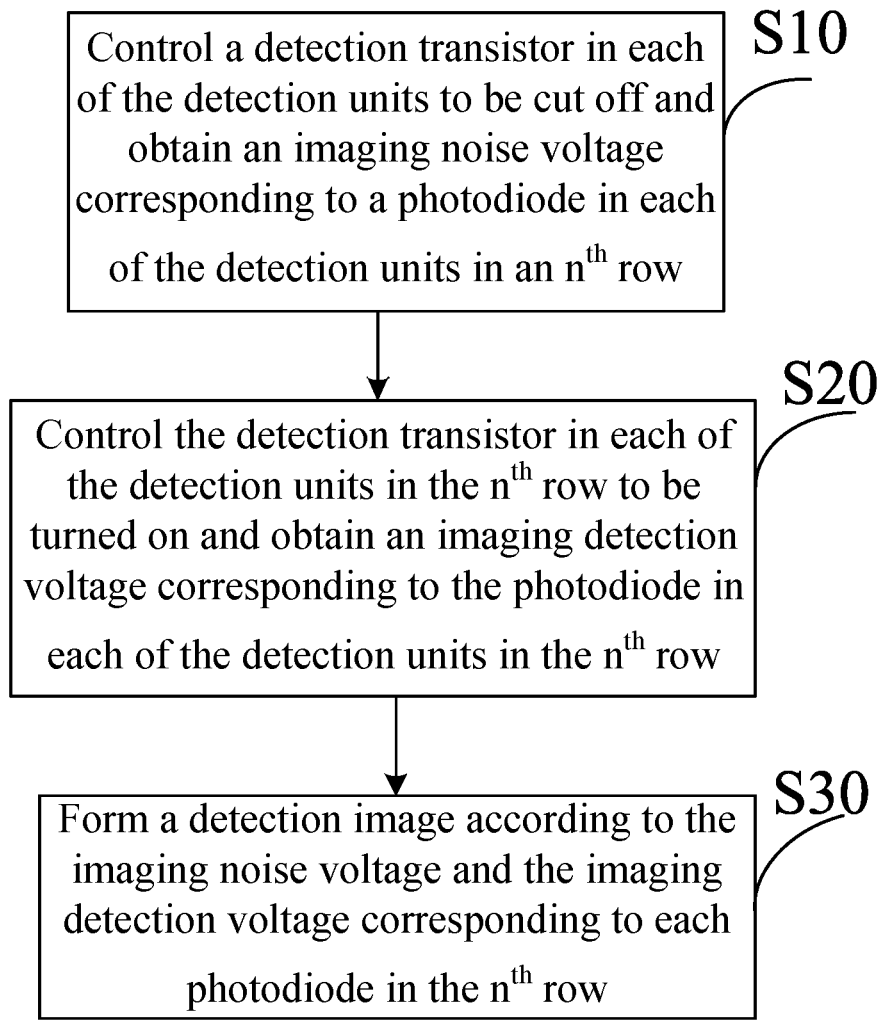
FIG. 7 is a flow chart of a driving method of a flat panel detector in an embodiment of the present disclosure.

As shown in FIG. 7, the driving method provided by an embodiment of the present disclosure, in the $n^{th}$ row collection stage, may include the following steps.

S10, a detection transistor in each of the detection units is controlled to be cut off, and an imaging noise voltage corresponding to a photodiode in each of the detection units in an $n^{th}$ row is obtained.

In some embodiments, a gate cut-off signal is loaded to each scanning line, so that each detection transistor is cut off. The imaging noise voltage $V_{cds1}$ corresponding to the photodiode in each of the detection units in the $n^{th}$ row is obtained through each detection line.

S20, the detection transistor in each of the detection units in the $n^{th}$ row is controlled to be turned on, and an imaging detection voltage corresponding to the photodiode in each of the detection units in the $n^{th}$ row is obtained.

In some embodiments, the detection transistor in each of the detection units only in the $n^{th}$ row is controlled to be turned on, and the detection transistors in detection units in other rows are controlled to be cut off, so that the imaging detection voltage $V_{cds2}$ corresponding to the photodiode in each of the detection units in the $n^{th}$ row is obtained through each detection line.

S30, an imaging effective voltage corresponding to each photodiode in the $n^{th}$ row is determined according to the imaging noise voltage and the imaging detection voltage corresponding to each photodiode in the $n^{th}$ row.

In some embodiments, a difference value between the imaging detection voltage $V_{cds2}$ and the imaging noise voltage $V_{cds1}$ corresponding to a same photodiode is determined and is used as the imaging effective voltage: $V_{cds2}-V_{cds1}=VL$, so that a detection image is formed through the imaging effective voltage $V_{cds2}-V_{cds1}$ after the $n^{th}$ row collection stage in the imaging detection stage is completed. As $V_{cds2}-V_{cds1}$ in the present disclosure may not be affected by a coupling capacitance, the gray scale uniformity of the formed detection image can be improved.

In some embodiments, before the imaging detection stage, the method may further include: a self-emptying stage for self-emptying an electrical charge of the photodiode L in each of the detection units. In the self-emptying stage, the detection transistor M1 in each of the detection units 110 is controlled to be turned on row by row, so that the electrical charge of the photodiode L in each of the detection units 110 is released.

Figure 8:
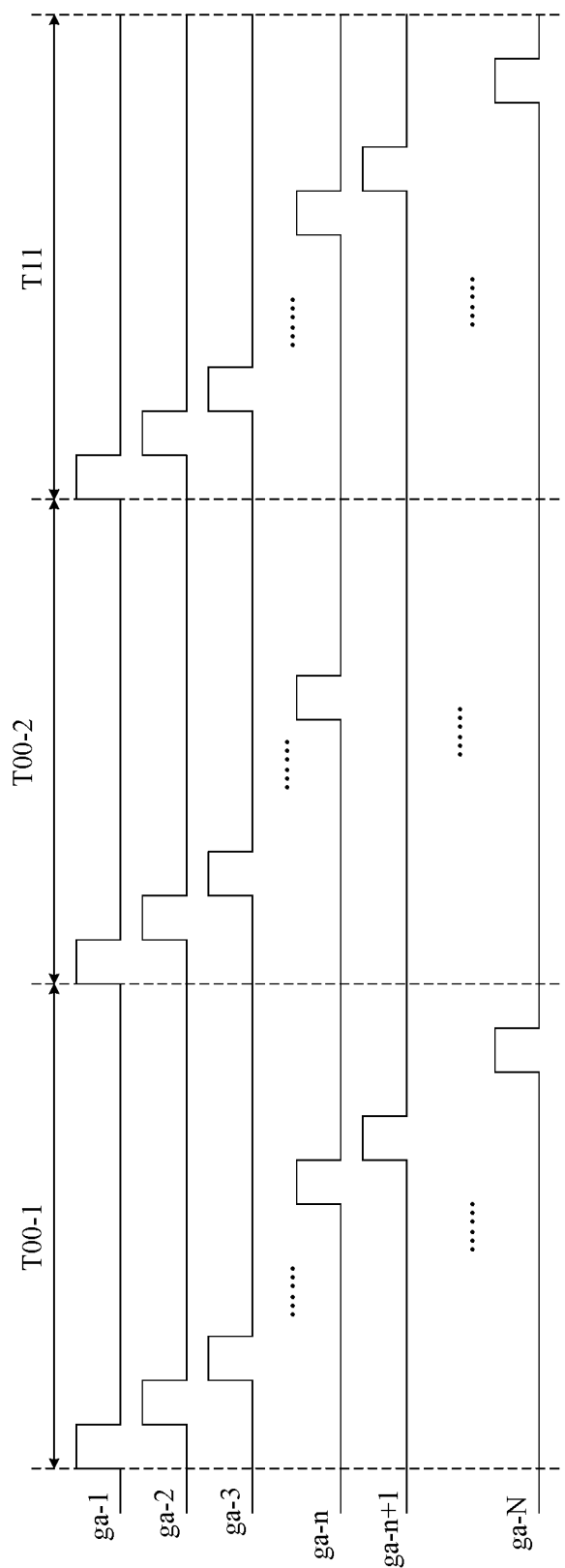
FIG. 8 is a sequence chart of some signals in an embodiment of the present disclosure.

As shown in FIG. 8, ga-n represents a signal loaded to a gate M1-G of the detection transistor M1 in each of the detection units 110 in the $n^{th}$ row. In a self-emptying stage T00-1, the detection transistor M1 in each of the detection units 110 may be controlled to be turned on row by row, so that the electrical charge of the photodiode L in each of the detection units 110 is released. In the self-emptying stage T00-2, when the $n^{th}$ row is scanned, if an exposure request signal is detected, self-emptying is stopped immediately and then exposure is started, namely, exposure is started from an $(n+1)^{th}$ row to an $N^{th}$ row. In this case, a difference between a gray scale of displaying from a first row to the $n^{th}$ row and a gray scale of displaying from the $(n+1)^{th}$ row to the $N^{th}$ row is large, and consequently, a problem of screen splitting of the detection image occurs.

In view of this, in some embodiments, in an embodiment of the present disclosure, before the imaging detection stage, the method may further include: at least one reset stage. In the current reset stage, the detection transistor M1 in each of the detection units 110 is controlled to be turned on, so that the photodiode L in each of the detection units 110 is reset. In this way, the detection transistor M1 in each of the detection units 110 is controlled to be turned on at the same time, thus each row of detection units 110 does not need to be scanned row by row, when exposure is detected, the imaging detection stage may be directly entered after electric discharging of photodiodes L in all the detection units 110 is finished, and the problem of screen splitting of the detection image is solved.

In some embodiment, after the detection transistor M1 in each of the detection units 110 is controlled to be turned on and the photodiode L in each of the detection units 110 is reset, the current reset stage may further include: detection transistors M1 in at least one row of detection units 110 are controlled to be turned on, detection control voltages corresponding to photodiodes L electrically connected with the turned on detection transistors M1 are obtained; and whether at least one of the obtained detection control voltages meets a voltage threshold or not is determined, when at least one of the obtained detection control voltages meets the voltage threshold, the imaging detection stage is entered, or when at least one of the obtained detection control voltages does not meet the voltage threshold, the next reset stage is entered.

In some embodiments, in this way, after electric discharging of all the photodiodes L is finished every time, the detection control voltages in at least one row of the detection units 110 are detected, whether exposure is received or not may be determined according to the detection control voltages, so that when exposure is received, the imaging detection stage may be directly entered. When exposure is not received, a repetitive operation process of the reset stage is performed again instead of entering the imaging detection stage.

In some embodiments, the detection transistors M1 in one row of detection units 110 may be controlled to be turned on, and the detection control voltages corresponding to the photodiodes L electrically connected with the turned on detection transistors M1 are obtained. Alternatively, the detection transistors M1 in two or more rows of detection units 110 may be controlled to be turned on, and the detection control voltages corresponding to the photodiodes L electrically connected with the turned on detection transistors M1 are obtained.

In order to fast switch the continuous reset stages, in some embodiments, duration of controlling one detection transistor M1 to be turned on in the reset stage may be identical to duration of controlling one detection transistor M1 to be turned on in the imaging detection stage.

The driving method provided by the present disclosure is described in detail below in combination with embodiments. It should to be noted that embodiments are intended to better illustrate but not limit the present disclosure.

Figure 9:
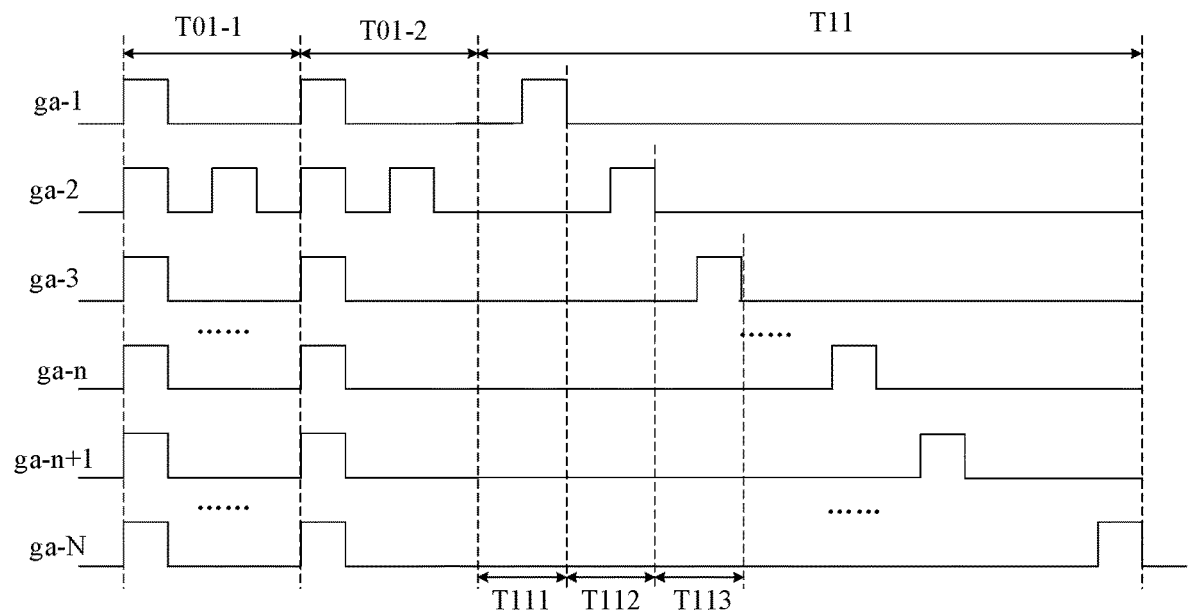
FIG. 9 is a sequence chart of yet some signals in an embodiment of the present disclosure.

As shown in FIG. 9, ga-n represents the signal loaded to the gate M1-G of each detection transistor M1 in the $n^{th}$ row of detection units 110.

In a reset stage T01-1, the detection transistor M1 in each of the detection units 110 is controlled to be turned on, so that the photodiode L in each of the detection units 110 is reset. In some embodiments, firstly, a gate M1-G turned-on signal (for example, a high level signal) is loaded to the scanning line GA electrically connected with each row of detection transistors M1, the detection transistor M1 in each of the detection units 110 may be controlled to be turned on at the same time, the negative electrodes of the photodiodes L are in communication with the detection lines SL, and thus, the electrical charges in the photodiodes L may be released through the detection lines SL.

The detection transistors M1 in one row of detection units 110 are controlled to be turned on, and the detection control voltages corresponding to the photodiodes L electrically connected with the turned on detection transistors M1 are obtained. In some embodiments, the gate M1-G turned-on signal may be loaded to the scanning line GA electrically connected with the detection transistors M1 in the second row of detection units 110, a gate M1-G cut-off signal (a low level signal) is loaded to each scanning GA electrically connected with the detection transistors M1 in the other detection units 110, the detection transistors M1 only in the second row may be controlled to be turned on, and the detection transistors M1 in the other rows may be controlled to be cut off. Thus, the detection control voltage corresponding to each of the photodiodes L in the second row may be obtained through the detection line SL.

Whether at least one of the obtained detection control voltages meets the voltage threshold or not is determined. Whether one of the obtained detection control voltages meets the voltage threshold or not may be determined, or whether some of the obtained detection control voltages meet the voltage threshold or not may be determined, or whether all of the obtained detection control voltages meet the voltage threshold or not may be determined.

For example, if the obtained detection control voltages do not meet the voltage threshold, the next reset stage T01-2 is entered.

In the reset stage T01-2, the detection transistor M1 in each of the detection units 110 is controlled to be turned on, so that the photodiode L in each of the detection units 110 is reset. In some embodiments, firstly, the gate M1-G turned-on signal (for example, a high level signal) is loaded to the scanning line GA electrically connected with each row of detection transistors M1, the detection transistor M1 in each of the detection units 110 may be controlled to be turned on, the negative electrodes of the photodiodes L are in communication with the detection lines SL, and thus, the electrical charges in the photodiodes L may be released through the detection lines SL.

The detection transistors M1 in one row of detection units 110 are controlled to be turned on, and the detection control voltages corresponding to the photodiodes L electrically connected with the turned on detection transistors M1 are obtained. In some embodiments, the gate M1-G turned-on signal may be loaded to the scanning line GA electrically connected with the detection transistors M1 in the second row of detection units 110, the gate M1-G cut-off signal (the low level signal) is loaded to each scanning line GA electrically connected with the detection transistors M1 in the other detection units 110, the detection transistors M1 only in the second row may be controlled to be turned on, and the detection transistors M1 in the other rows are controlled to be cut off. Thus, the detection control voltage corresponding to each of the photodiodes L in the second row may be obtained through the detection lines SL.

Whether at least one of the obtained detection control voltages meets the voltage threshold is determined. Whether one of the obtained detection control voltages meets the voltage threshold or not may be determined, or whether some of the obtained detection control voltages meet the voltage threshold or not may be determined, or whether all of the obtained detection control voltages meet the voltage threshold or not may be determined.

For example, if the obtained detection control voltages meet the voltage threshold, the imaging detection stage T11 is entered.

In the imaging detection stage T11, in a first row collection stage T111, the gate M1-G cut-off signal is loaded to the scanning line GA electrically connected with each row of detection transistors M1, thus the detection transistor M1 in each of the detection units 110 is controlled to be cut off, and the imaging noise voltage $V_{cds1-1}$ corresponding to the photodiode L in each of the detection units 110 in the first row is obtained.

The gate M1-G turned-on signal is loaded to the scanning line GA electrically connected with the detection transistors M1 in the first row, the gate M1-G cut-off signal is loaded to the scanning lines GA electrically connected with the detection transistors M1 in the other rows, the detection transistor M1 in each of the detection units 110 in the first row is controlled to be turned on, the detection transistor M1 in each of the detection units 110 in the other rows is controlled to be cut off, and thus the imaging detection voltage $V_{cds2-1}$ corresponding to the photodiode L in each of the detection units 110 in the first row is obtained.

The imaging effective voltage corresponding to the photodiode L in each of the detection units 110 in the first row is determined to be: $V_{cds2-1}-V_{cds1-1}$.

In a second row collection stage T112, the gate M1-G cut-off signal is loaded to the scanning line GA electrically connected with each row of detection transistor M1, the detection transistor M1 in each of the detection units 110 is controlled to be cut off, and the imaging noise voltage $V_{cds1-2}$ corresponding to the photodiode L in each of the detection units 110 in the second row is obtained.

The gate M1-G turned-on signal is loaded to the scanning line GA electrically connected with the detection transistors M1 in the second row, the gate M1-G cut-off signal is loaded to the scanning lines GA electrically connected with the detection transistors M1 in the other rows, the detection transistor M1 in each of the detection units 110 in the second row is controlled to be turned-on, the detection transistor M1 in each of the detection units 110 in the other rows is controlled to be cut off, and the imaging detection voltage $V_{cds2-2}$ corresponding to the photodiode L in each of the detection units 110 in the second row is obtained through each detection line SL.

The imaging effective voltage corresponding to the photodiode L in each of the detection units 110 in the second row is determined to be: $V_{cds2-2}-V_{cds1-2}$.

In a third row collection stage T113, the gate M1-G cut-off signal is loaded to the scanning line GA electrically connected with each row of detection transistors M1, the detection transistor M1 in each of the detection units 110 is controlled to be cut off, and the imaging noise voltage $V_{cds1-3}$ corresponding to the photodiode L in each of the detection units 110 in the third row is obtained.

The gate M1-G turned-on signal is loaded to the scanning line GA electrically connected with the third row of detection transistors M1, the gate M1-G cut-off signal is loaded to the scanning lines GA electrically connected with the detection transistors M1 in the other rows, the detection transistor M1 in each of the detection units 110 in the third row is controlled to be turned-on, the detection transistor in each of the detection units 110 in the other rows is controlled to be cut off, and the imaging detection voltage $V_{cds2-3}$ corresponding to the photodiode L in each of the detection units 110 in the third row is obtained through each detection line SL.

The imaging effect voltage corresponding to the photodiode L in each of the detection units 110 in the third row is determined to be: $V_{cds2-3}-V_{cds1-3}$.

A working process of a fourth row collection stage to an $N^{th}$ row collection stage is done in the same manner and will not be detailed herein.

An embodiment of the present disclosure further provides a driving device of a flat panel detector, including: a driving circuit, where the driving circuit is configured to implement the above driving method.

In some embodiments, the driving circuit may be a driving integrated circuit (IC).

It should to be noted that a driving principle and an implementation of the driving circuit are the same as a principle and an implementation of embodiments of the above driving method, so that a working process of the driving circuit may be implemented by referring to the implementation of the driving method in embodiments and will not be detailed herein.

An embodiment of the present disclosure further provides a flat panel detection device, including the above flat panel detector and/or the driving device of the flat panel detector provided by embodiments of the present disclosure. A principle of the flat panel detection device to solve problems is similar to that of the aforementioned display panel, so that implementation of the flat panel detection device may be referred to implementation of the aforementioned display panel, and repetitions are omitted herein.

In some embodiments, in embodiments of the present disclosure, other essential components of the flat panel detection device should be understood by those ordinarily skilled in the art and will be neither detailed herein nor supposed to limit the present disclosure.

Apparently, those skilled in the art can make various changes and modifications for the present disclosure without departing from the spirit and scope of the present disclosure. In this case, if these changes and modifications of the present disclosure fall within the scope of claims and their equivalents, the present disclosure also intends to include these changes and modifications.

What is claimed is:

1. A flat panel detector, comprising: a base substrate, and a plurality of detection units located on the base substrate, wherein each of the detection units comprises a photodiode and a detection transistor; and the flat panel detector further comprises: a compensation semiconductor material layer, wherein the compensation semiconductor material layer comprises a plurality of compensation structures mutually spaced, each detection transistor is correspondingly provided with a compensation structure, and the compensation structure is located between a gate and a gate insulating layer of the corresponding detection transistor; wherein the compensation structure surrounds the gate;

wherein a material of the gate comprises metal; and a material of the compensation semiconductor material layer comprises: a doped P-type semiconductor material;

wherein the gate is in direct contact with the compensation semiconductor material layer; a work function of the compensation semiconductor material layer is larger than a work function of the gate.

2. The flat panel detector according to claim 1, wherein the gate comprises a plurality of gate film layers; and the work function of the compensation semiconductor material layer is larger than a work function of a gate film layer of the gate closest to the compensation semiconductor material layer.

3. The flat panel detector according to claim 1, further comprising: a contact semiconductor material layer, wherein the contact semiconductor material layer is located between an active layer and a source-drain layer.

4. The flat panel detector according to claim 3, wherein the contact semiconductor material layer comprises a plurality of first contact structures and a plurality of second contact structures arranged in a spaced mode, a first electrode of the detection transistor is correspondingly provided with one of the first contact structures, and a second electrode of the detection transistor is correspondingly provided with one of the second contact structures.

5. The flat panel detector according to claim 4, wherein an orthographic projection of the first electrode of the detection transistor on the base substrate covers an orthographic projection of the corresponding first contact structure on the base substrate, and the first electrode of the detection transistor is in contact with the active layer through the corresponding first contact structure.

6. The flat panel detector according to claim 4, wherein an orthographic projection of the second electrode of the detection transistor on the base substrate covers an orthographic projection of the corresponding second contact structure on the base substrate, and the second electrode of the detection transistor is in contact with the active layer through the corresponding second contact structure.

7. The flat panel detector according to claim 3, wherein a material of the contact semiconductor material layer comprises an N-type semiconductor material layer.

8. A driving method of the flat panel detector according to claim 1, comprising: an imaging detection stage, wherein the imaging detection stage comprises: N continuous row collection stages, and N is a total number of rows of detection units in the flat panel detector;

in an $n^{th}$ row collection stage, controlling a detection transistor in each of the detection units to be cut off, and obtaining an imaging noise voltage corresponding to a photodiode in each of the detection units in an $n^{th}$ row, wherein $1 \leq n \leq N$ and n is an integer;

controlling the detection transistor in each of the detection units in the $n^{th}$ row to be turned on, and obtaining an imaging detection voltage corresponding to the photodiode in each of the detection units in the $n^{th}$ row; and determining an imaging effective voltage corresponding to each photodiode in the $n^{th}$ row according to the imaging noise voltage and the imaging detection voltage corresponding to each photodiode in the $n^{th}$ row.

9. The driving method of the flat panel detector according to claim 8, before the imaging detection stage, further comprising:

in a current reset stage, controlling the detection transistor in each of the detection units to be turned on at the same time so as to reset the photodiode in each of the detection units.

10. The driving method of the flat panel detector according to claim 9, wherein after controlling the detection transistor in each of the detection units to be turned on at the same time so as to reset the photodiode in each of the detection units, the current reset stage further comprises:

controlling detection transistors in at least one row of detection units to be turned on, and obtaining detection control voltages corresponding to photodiodes electrically connected with the turned on detection transistors;

determining whether at least one of the obtained detection control voltages meets a voltage threshold or not;

entering into the imaging detection stage when at least one of the obtained detection control voltages meets the voltage threshold; and entering into the next reset stage when at least one of the obtained detection control voltages does not meet the voltage threshold.

11. The driving method of the flat panel detector according to claim 9, wherein duration of controlling one detection transistor to be turned on in the reset stage is identical to duration of controlling one detection transistor to be turned on in the imaging detection stage.

12. A driving device of a flat panel detector, comprising: a driving circuit, wherein the driving circuit is configured to execute the driving method according to claim 8.

13. A flat panel detection device, comprising the driving device of the flat panel detector according to claim 12.

14. A flat panel detection device, comprising a flat panel detector, the flat panel detector comprising: a base substrate, and a plurality of detection units located on the base substrate, wherein each of the detection units comprises a photodiode and a detection transistor; and the flat panel detector further comprises: a compensation semiconductor material layer, wherein the compensation semiconductor material layer comprises a plurality of compensation structures mutually spaced, each detection transistor is correspondingly provided with a compensation structure, and the compensation structure is located between a gate and a gate insulating layer of the corresponding detection transistor; wherein the compensation structure surrounds the gate;

wherein a material of the gate comprises metal; and a material of the compensation semiconductor material layer comprises: a doped P-type semiconductor material;

wherein the gate is in direct contact with the compensation semiconductor material layer; a work function of the compensation semiconductor material layer is larger than a work function of the gate.

* * * * *